United States Patent
Iwamori et al.

(10) Patent No.: US 7,577,323 B2
(45) Date of Patent: Aug. 18, 2009

(54) PHOTOELECTRIC CIRCUIT BOARD

(75) Inventors: Toshimichi Iwamori, Tokyo (JP); Yoshihisa Ueda, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/120,394

(22) Filed: May 14, 2008

(65) Prior Publication Data
US 2009/0010591 A1    Jan. 8, 2009

(30) Foreign Application Priority Data
Jul. 2, 2007    (JP) ............................. 2007-174479
Aug. 28, 2007    (JP) ............................. 2007-221368

(51) Int. Cl.
*G02B 6/12* (2006.01)

(52) U.S. Cl. ............................. 385/14; 385/40; 257/734

(58) Field of Classification Search .................. 385/14, 385/40; 257/734
See application file for complete search history.

(56) References Cited

U.S. PATENT DOCUMENTS

| | | | |
|---|---|---|---|
| 3,777,154 A * | 12/1973 | Lindsey ................. | 250/227.11 |
| 5,042,896 A * | 8/1991 | Dahlgren ...................... | 385/31 |
| 5,444,723 A * | 8/1995 | Chandonnet et al. .......... | 372/14 |
| 6,285,808 B1 * | 9/2001 | Mehlhorn et al. ............. | 385/14 |
| 6,625,349 B2 * | 9/2003 | Zhao et al. .................... | 385/30 |
| 6,739,761 B2 * | 5/2004 | Tsukamoto et al. ........... | 385/89 |
| 6,744,948 B1 * | 6/2004 | Pi et al. ........................ | 385/30 |
| 7,068,868 B1 * | 6/2006 | Pi et al. ........................ | 385/12 |
| 7,263,256 B2 * | 8/2007 | Kim et al. ...................... | 385/32 |
| 7,310,457 B2 * | 12/2007 | Kotake ......................... | 385/14 |
| 7,340,121 B2 * | 3/2008 | Yonekura et al. ............. | 385/14 |
| 2002/0039464 A1 * | 4/2002 | Yoshimura et al. ............ | 385/14 |
| 2003/0039455 A1 * | 2/2003 | Ouchi ........................... | 385/88 |
| 2003/0103712 A1 * | 6/2003 | Glebov et al. ................. | 385/14 |
| 2003/0117614 A1 | 6/2003 | Kikuchi et al. | |
| 2004/0033007 A1 | 2/2004 | Ohtsu et al. | |
| 2005/0196096 A1 | 9/2005 | Ohtsu et al. | |
| 2006/0045418 A1 * | 3/2006 | Cho et al. ...................... | 385/31 |
| 2006/0126995 A1 * | 6/2006 | Glebov et al. ................. | 385/15 |
| 2006/0245681 A1 * | 11/2006 | Uchida ........................ | 385/14 |
| 2007/0223935 A1 * | 9/2007 | Asai et al. .................... | 398/164 |

FOREIGN PATENT DOCUMENTS

| | | |
|---|---|---|
| JP | 2001-174655 A | 6/2001 |
| JP | 2003-185526 A | 7/2003 |
| JP | 2004-29507 A | 1/2004 |
| JP | 2004-302401 A | 10/2004 |
| JP | 2006-52992 A | 2/2006 |

* cited by examiner

*Primary Examiner*—Ellen Kim
(74) *Attorney, Agent, or Firm*—Sughrue Mion, PLLC

(57) ABSTRACT

A photoelectric circuit board includes a substrate, an optical waveguide and a core exposure surface. The substrate has an inspection opening. The optical waveguide includes a core and a clad formed around the core. The optical waveguide is formed on one surface side of the substrate, is exposed to the inspection opening, and has a portion curved toward the inspection opening. The core exposure surface is formed in the curved portion of the optical waveguide so that the core is exposed out of the clad.

6 Claims, 9 Drawing Sheets

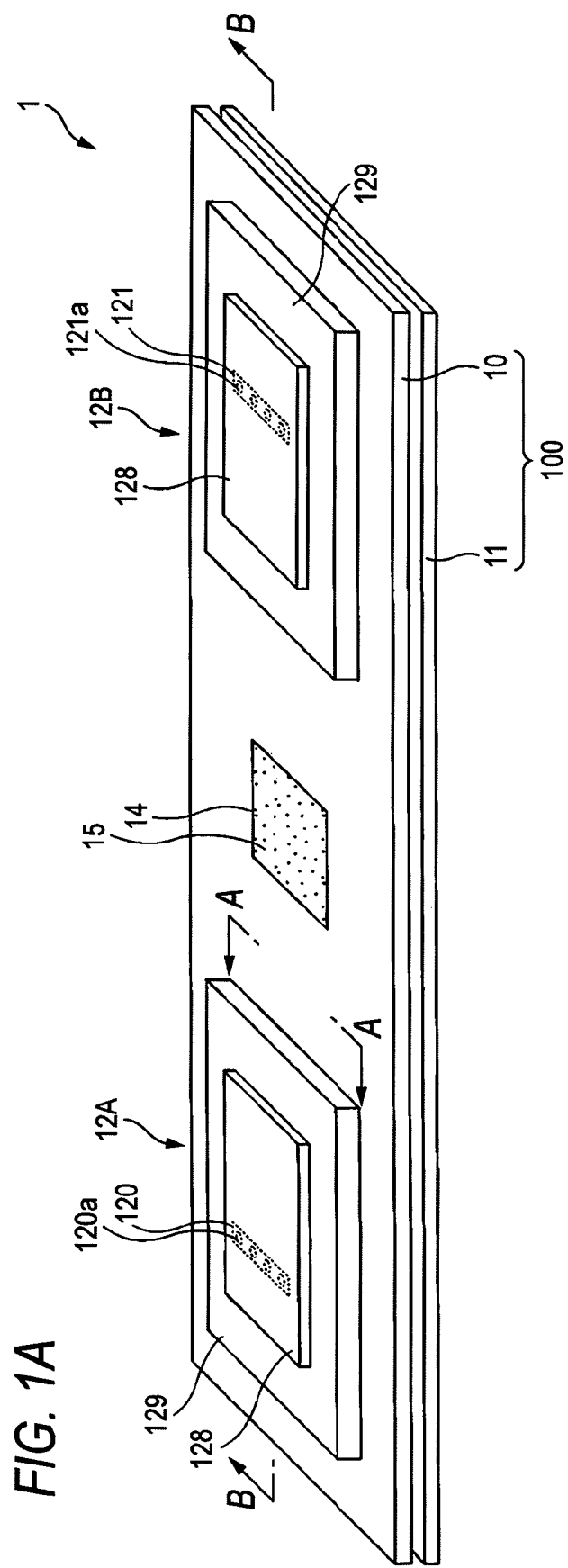
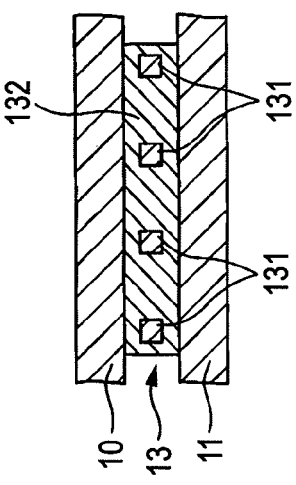
FIG. 1A
FIG. 1B

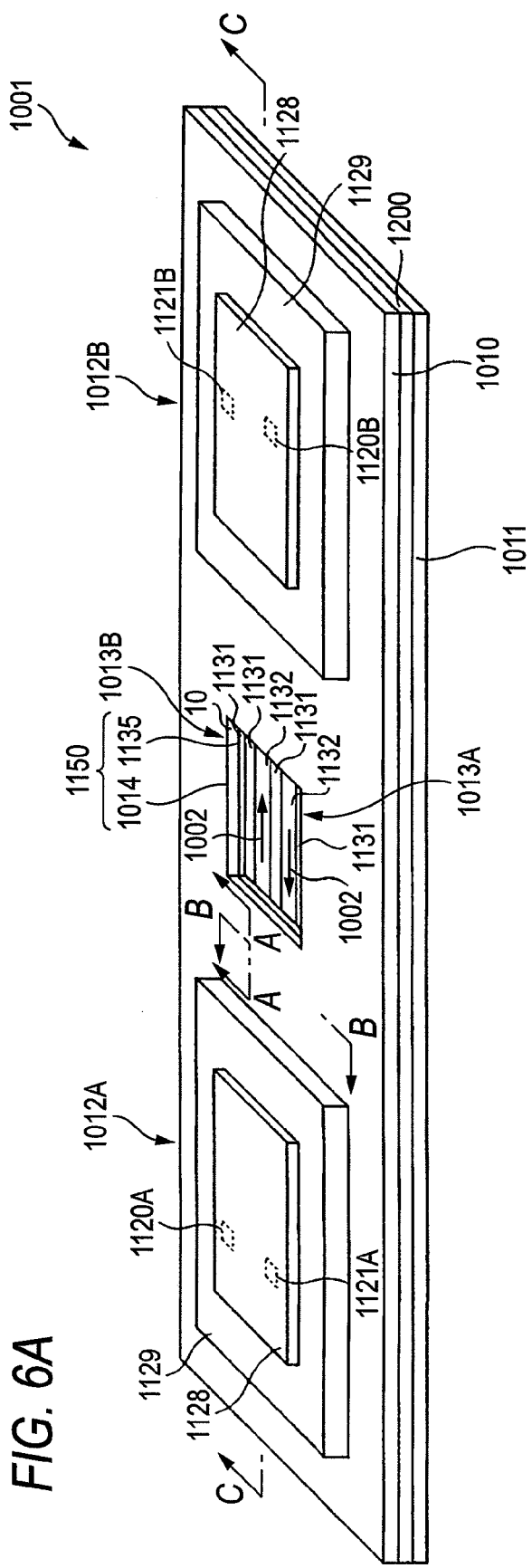
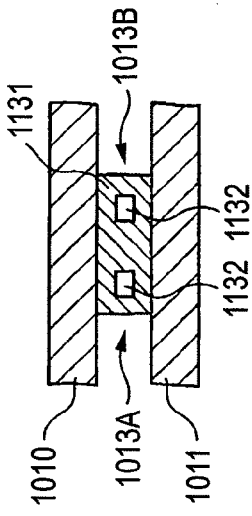
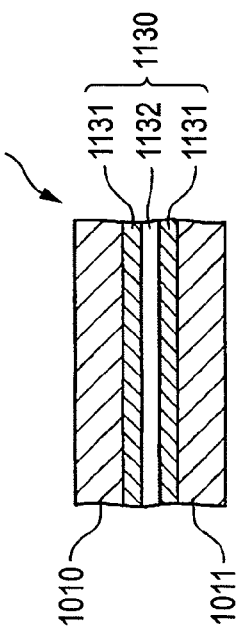
FIG. 6A
FIG. 6B
FIG. 6C

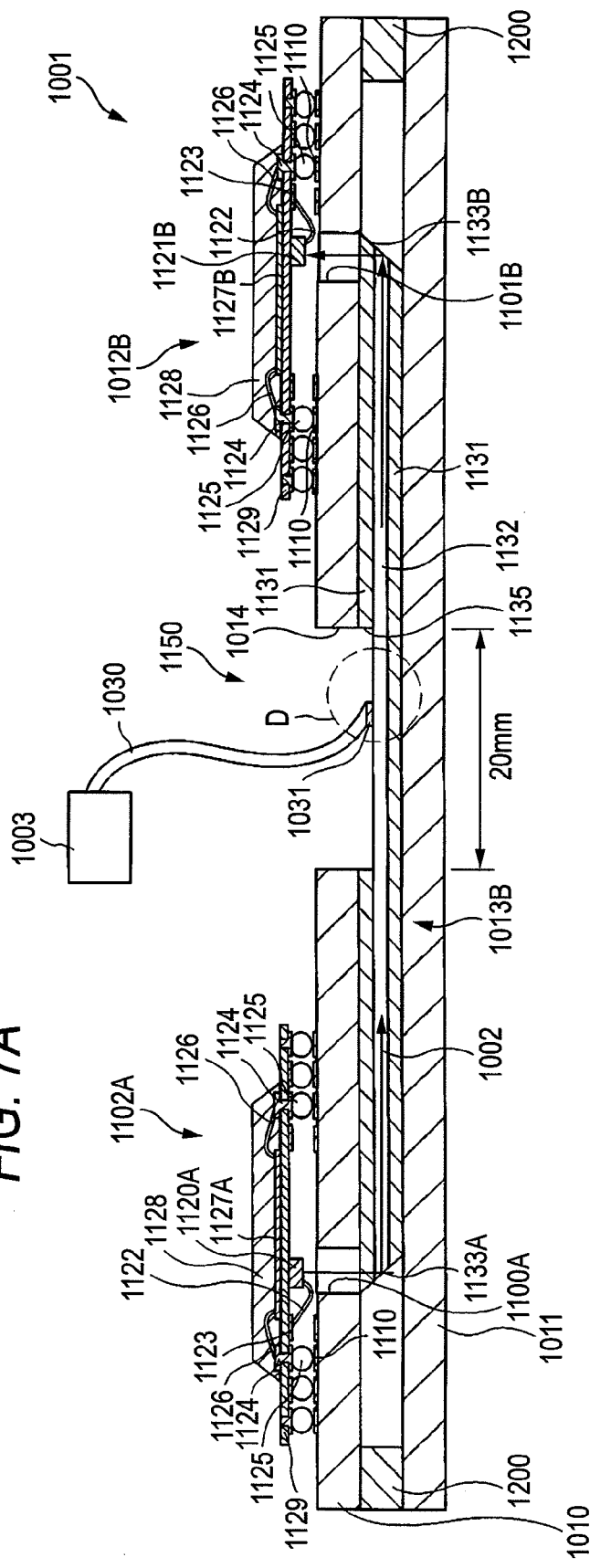
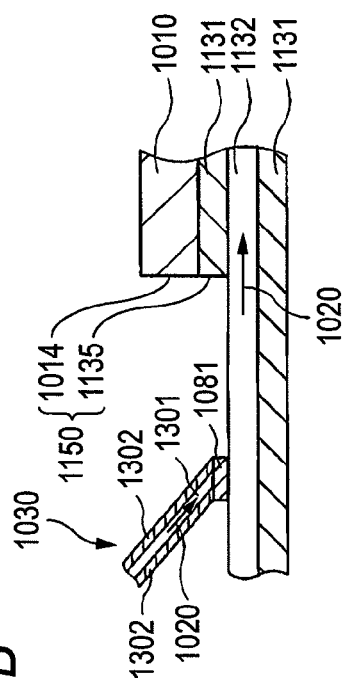
FIG. 7A
FIG. 7B

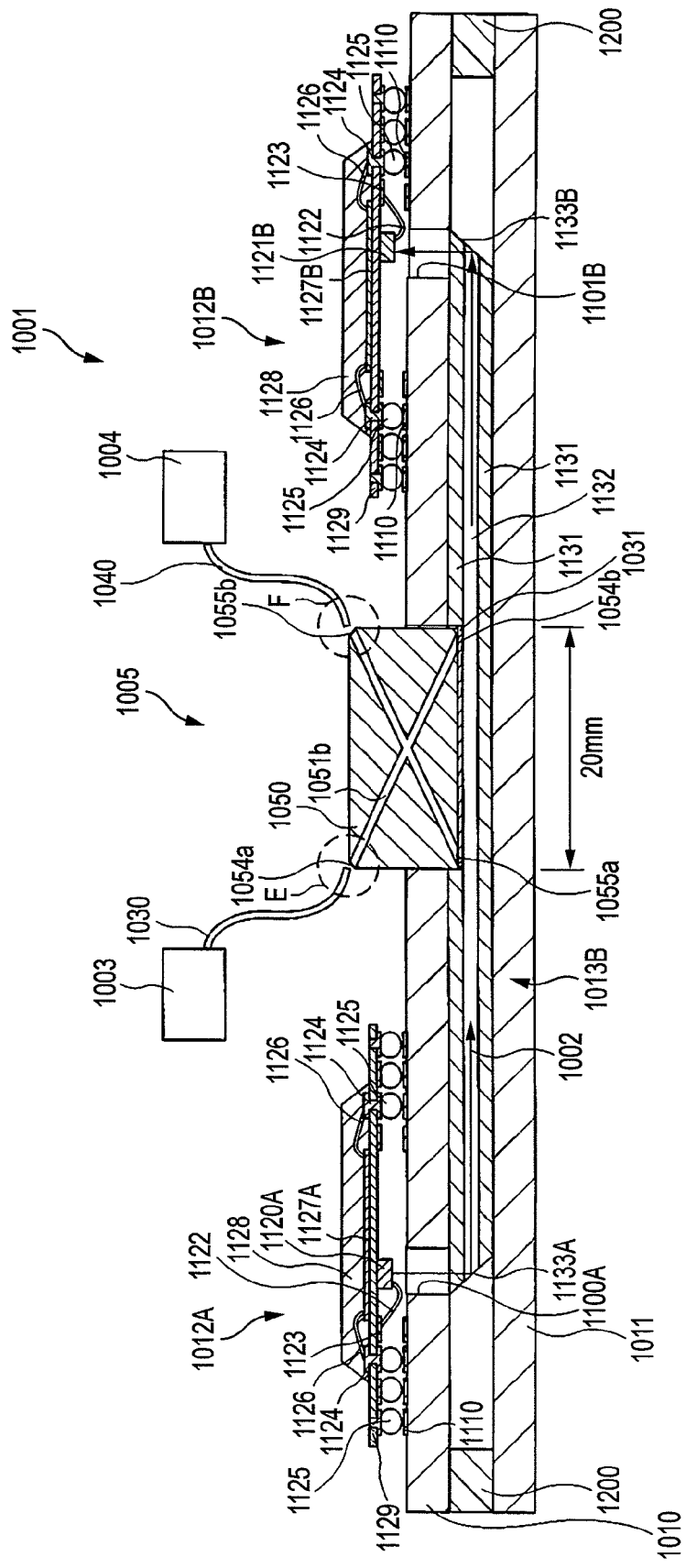

FIG. 9A
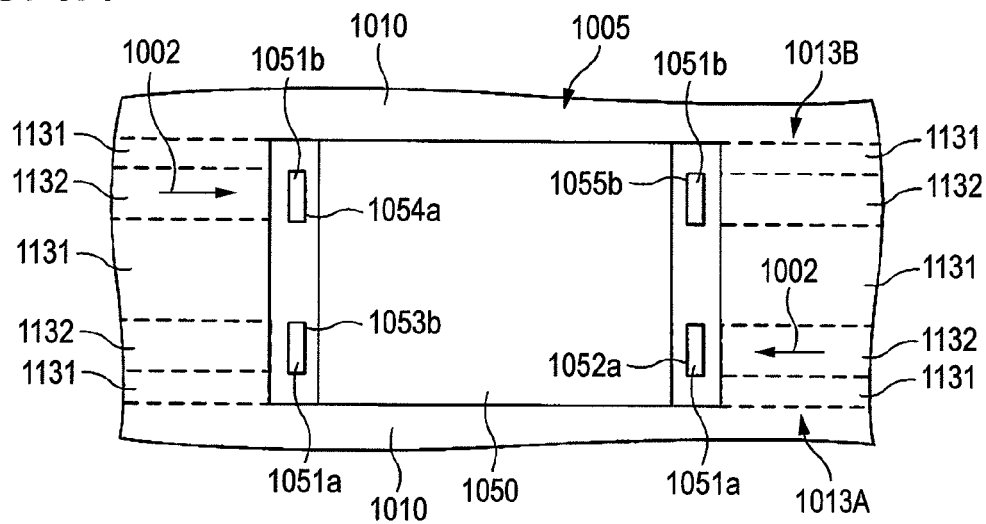
FIG. 9B
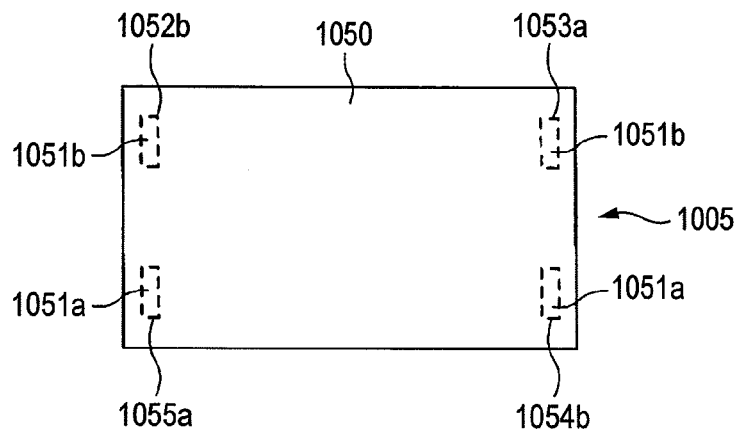
FIG. 9C
FIG. 9D
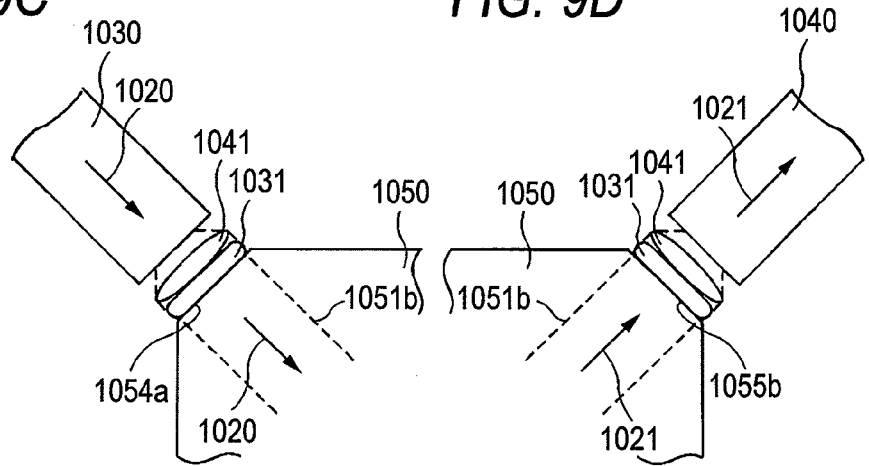

PHOTOELECTRIC CIRCUIT BOARD

CROSS-REFERENCE TO RELATED APPLICATIONS

This application is based on and claims priority under 35 U.S.C. §119 from Japanese Patent Application Nos. 2007-174479 (filed on Jul. 2, 2007) and 2007-221368 (filed on Aug. 28, 2008).

BACKGROUND

Technical Field

The invention relates to a photoelectric circuit board.

SUMMARY

A photoelectric circuit board includes a substrate, an optical waveguide and a core exposure surface. The substrate has an inspection opening. The optical waveguide includes a core and a clad formed around the core. The optical waveguide is formed on one surface side of the substrate, is exposed to the inspection opening, and has a portion curved toward the inspection opening. The core exposure surface is formed in the curved portion of the optical waveguide so that the core is exposed out of the clad.

BRIEF DESCRIPTION OF THE DRAWINGS

Exemplary embodiments of the invention will be described in detail below with reference to the accompanying drawings, wherein:

FIGS. 1A and 1B are views schematically illustrating the configuration of a photoelectric circuit board according to a first exemplary embodiment of the invention, and FIG. 1A is a perspective view and FIG. 1B is a section view taken along the line A-A in FIG. 1A;

FIG. 6A is a perspective view illustrating a photoelectric circuit board according to a third exemplary embodiment of the invention, FIG. 6B is a section view illustrating the photoelectric circuit board according to the third exemplary embodiment of the invention taken along the line A-A of FIG. 6A, and FIG. 6C is a section view illustrating the photoelectric circuit board according to the third exemplary embodiment of the invention taken along the line B-B of FIG. 6A;

FIG. 7A is a section view illustrating the photoelectric circuit board according to the third exemplary embodiment of the invention taken along the line C-C of FIG. 6A, and FIG. 7B is a section view illustrating a D part of the photoelectric circuit board according to the third exemplary embodiment of the invention;

FIG. 8 is a section view that is taken along the line C-C of FIG. 6A and illustrates the photoelectric circuit board into which a jig according to a fourth exemplary embodiment of the invention is inserted; and FIG. 9A is a plan view illustrating an upper surface of the jig according to the fourth exemplary embodiment of the invention, FIG. 9B is a plan view illustrating a lower surface of the jig according to the fourth exemplary embodiment of the invention, FIG. 9C is an enlarged view illustrating an E portion in the fourth exemplary embodiment of the invention, and FIG. 9D is an enlarged view illustrating an F portion in the fourth exemplary embodiment of the invention.

DETAILED DESCRIPTION

First Exemplary Embodiment

Figure 2A:
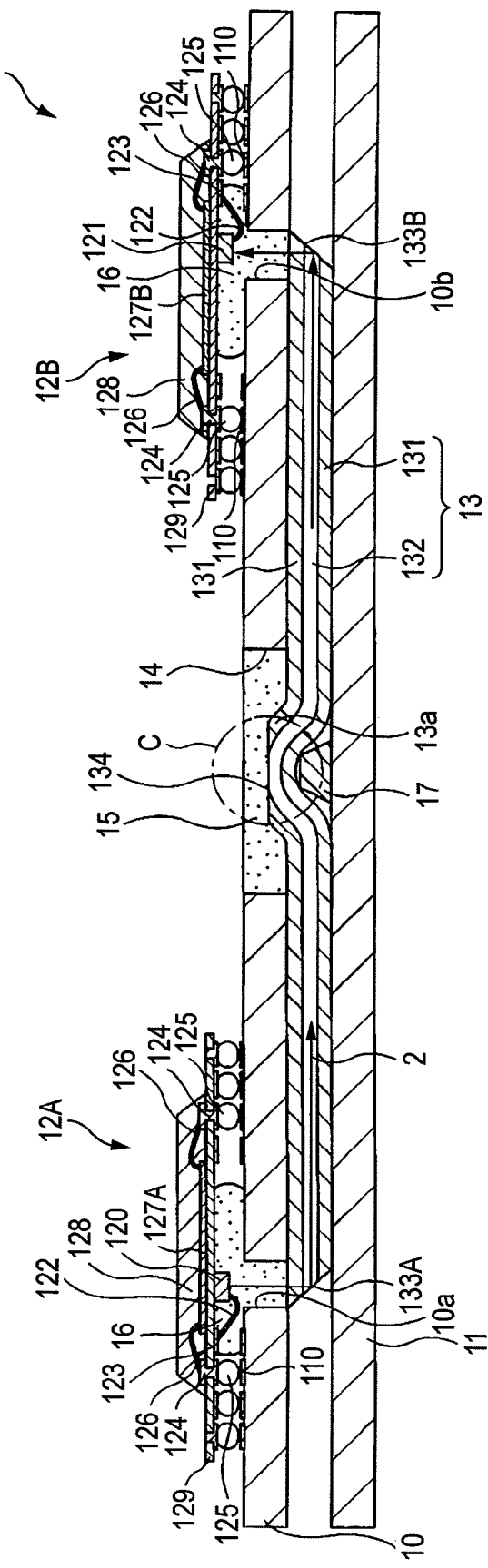
FIG. 2A is a section view taken along the line B-B in FIG. 1A.

FIGS. 1A and 1B are views schematically illustrating the configuration of a photoelectric circuit board according to a first exemplary embodiment of the invention. FIG. 1A is a perspective view and FIG. 1B is a section view taken along the line A-A of FIG. 1A.

In a photoelectric circuit board 1, an optical circuit and an electronic circuit are combined together. The photoelectric circuit board 1 has the configuration that an optical waveguide 13 (refer to FIG. 1B) is embedded in a printed circuit board 100.

The printed circuit board 100 is configured to include first and second substrates 10 and 11 disposed with the optical waveguide 13 being interposed therebetween. The first and second optical modules 12A and 12B are mounted on an upper surface (first surface) of the first substrate 10. The optical modules 12A and 12B are optically connected to the optical waveguide 13. The number of substrates (number of layers) having wiring lines in the printed circuit board 100 is not limited to two but may be three or more.

The first optical module 12A has a light emitting element array 120 in which a plurality of light emitting elements 120a are arrayed in a line, and a driving circuit for driving the light emitting elements 120a. The second optical module 12B has a light emitting element array 121 in which a plurality of light receiving elements 121a are arrayed in a line, and an amplifying circuit for amplifying output signals from the light receiving elements 121a. Each of the first and second optical modules 12A and 12B is formed into a package. The specific configurations of the first and second optical modules 12A and 12B will be described later.

(First Substrate)

The first substrate 10 includes a base formed of an insulating material, such as glass epoxy resin with a thickness of 0.5 mm, and a conductive pattern which is formed on an upper surface of the base. Various kinds of electronic components, power supply circuit components, and the like are electrically connected to the conductive pattern.

Also, the first substrate 10 has an inspection opening 14 which is a through hole used to input/output inspection light to/from an optical waveguide, as shown in FIG. 1A. After the inspection is completed, the inspection opening 14 is filled with a clad material filling portion 15. The inspection opening 14 has such aperture diameter that a curved portion (which will be described later) of the optical waveguide 13 can be exposed, for example, 5×5 mm.

The clad material filling portion 15 is made of a resin having the same refractive index as a clad 132 of the optical waveguide 13.

(Second Substrate)

The second substrate 11 includes a base formed of an insulating material, such as glass epoxy resin with a thickness of 1 mm, and a conductive pattern which is formed on a lower surface of the base. Various kinds of electronic components, power supply circuit components, and the like are electrically connected to the base. The second substrate 11 has a protruding portion 17 made of a synthetic resin, for example, in a position where the protruding portion 17 faces the inspection opening 14 of an upper surface of the base. The protruding portion 17 has a trapezoidal shape in section. However, the protruding portion 17 may have another shape, such as a semicircular shape.

(Optical Waveguide)

As shown in FIG. 1B, the optical waveguide 13 is configured to include four cores 131, each of which has a thickness of 0.2 mm in total and has a rectangular sectional shape of 50×50 μm, and a clad 132 which is formed around the cores 131 and has a refractive index smaller than those of the cores 131.

Figure 2B:
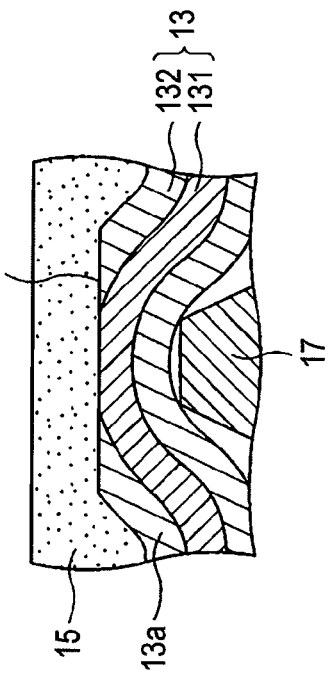
FIG. 2B is a view illustrating details of a portion C in FIG. 2A.

FIGS. 2A and 2B are views schematically illustrating the photoelectric circuit board according to the first exemplary embodiment of the invention. FIG. 2A is a section view taken along the line B-B of FIG. 1A. FIG. 2B is a view illustrating details of a C portion in FIG. 2A.

(First Optical Module)

The first optical module 12A includes a relay board 129, the light emitting element array 120 mounted on a lower surface of the relay board 129, and a control section 127A mounted on an upper surface of the relay board 129.

The relay board 129 has a base made of an insulating material. A pad 123 and a terminal 124 are formed on the base. The terminal 124 is electrically connected to a terminal 110 of the first substrate 10 through a solder ball (conductive ball) 125, such as a BGA (ball grid array).

The control section 127A has a built-in driving circuit for driving four light emitting elements 120a, is bonded to the relay board 129 with an adhesive, and is connected to the terminal 124 through a wiring 126. The entire control section 127A is sealed with a sealing resin 128, such as an epoxy resin.

An optical resin 16 having the same refractive index as the clad 132 seals a portion between the light emitting element array 120 and the optical waveguide 13.

A surface light emitting element having a light output surface (optical surface), from which an optical signal is output, and a mounting surface on the opposite side is used as the light emitting element 120a of the light emitting element array 120. For example, a surface light emitting diode or a surface emitting laser may be used as the surface light emitting element. In this exemplary embodiment, the surface emitting laser is used. In a surface emitting laser array using the surface emitting lasers, an n-type lower reflection mirror layer, an active layer, a current constriction layer, a p-type upper reflection mirror layer, a p-type contact layer, and a p-side electrode are formed on an n-type GaAs substrate, and an n side electrode is formed on a bottom surface of the n-type GaAs substrate, for example. The active layer, the current constriction layer, the p-type upper reflection mirror layer, the p-type contact layer, and the p-side electrode are formed for every light emitting element 120a and are electrically connected to the pad 123 of the relay board 129 through a wiring 122.

(Second Optical Module)

The second optical module 12B includes the same relay board 129 as in the first optical module 12A, a light receiving element array 121 mounted on a lower surface of the relay board 129, and a control section 127B mounted on an upper surface of the relay board 129.

The control section 127B has a built-in amplifying circuit for amplifying electrical signals output from the four light receiving elements 121a and a built-in signal processing circuit for converting the signals output from the amplifying circuit into image signals and the like, is bonded to the relay board 129 with an adhesive, and is connected to the terminal 124 through the wiring 126. The entire control section 127B is sealed with the sealing resin 128, such as an epoxy resin.

A surface light receiving element having a light input surface (optical surface), through which an optical signal is input, and a mounting surface on the opposite side is used as the light receiving element 121a of the light receiving element array 121. For example, a surface photodiode may be used as the surface light receiving element. In this exemplary embodiment, a GaAs-based PIN photodiode excellent in terms of high-speed response is used. The light receiving element array 121 using the PIN photodiode has a P layer, an I layer, and an N layer which form a PIN junction, a p-side electrode connected to the P layer, and an n side electrode formed in the N layer. The P layer, the I layer, the N layer, the p-side electrode and the n-side electrode are formed on a GaAs substrate. The p layer, the I layer, the N layer, the p side electrode, and the n side electrode are formed for every light receiving element 121a and are electrically connected to the pad 123 of the relay board 129 through the wiring 122.

The optical resin 16 having the same refractive index as the clad 132 seals a portion between the light receiving element array 121 and the optical waveguide 13.

(First Substrate)

The first substrate 10 has four emission-side openings 10a which are formed in positions where the emission-side openings 10a face the four light emitting elements 120a, respectively, and four receiving-side openings 10b which are formed in position where the receiving-side openings 10b face the four light receiving elements 121a, respectively. Each of (i) the four emission-side openings 10a and (ii) the four receiving-side openings 10b may be one common opening.

(Optical Waveguide)

The optical waveguide 13 is exposed to the inspection opening 14 along the protruding portion 17 and has the curved portion 13a curved toward the inspection opening 14. A core exposure surface 134 is formed in the curved portion 13a so that the core 131 is exposed out of the clad 132.

(Methods of Manufacturing and Inspecting Photoelectric Circuit Board)

Next, an example of a method of manufacturing the photoelectric circuit board and a method of inspecting the photoelectric circuit board will be described. Inspection of the photoelectric circuit board is performed in a process of manufacturing of the photoelectric circuit board.

(1) Manufacturing of Optical Waveguide

First, an example of manufacturing the optical waveguide 13 will be described. The optical waveguide 13 may be manufactured by using, for example, a photolithography or RIE (reactive ion etching) which are generally used in this technical field. In particular, the optical waveguide 13 can be efficiently manufactured by a manufacturing process that uses a mold as described in JP 2004-29507 A (corresponding to US 2004/0033007 A and US 2005/0196096 A). This manufacturing process will be described below.

First, a master disk formed with protruding portions corresponding to the four cores 131 is manufactured by the photolithography, for example. Then, a layer of a curable resin having a property of allowing light in an ultraviolet range or a visible range, for example, to transmit therethrough and having a viscosity of about 500 to 7000 mPa·s is formed on a surface of the master disk by coating or the like and is then cured to thereby form a hardening layer. The curable resin may be curable organopolysiloxane containing a methylsiloxane group, an ethylsiloxane group, and a phenylsiloxane group in molecules. Then, the hardening layer is peeled off from the master disk and a mold having recess portions corresponding to the protruding portions is manufactured.

Then, a film base for clad made of a resin excellent in adhesiveness with the mold, for example, an alicyclic acrylic resin film, an alicyclic olefin resin film, a triacetic acid cellulose film, or a fluororesin film is brought to be in close contact with the mold. Then, the recess portions of the mold are filled with a curable resin, such as epoxy-based, polyimide-based, or acrylic-based ultraviolet curable resin, ultraviolet curable or heat curable monomer and oligomer, and a compound of monomer and oligomer. Then, the curable resin in the recess portions is cured to make the cores 131, and then the mold is peeled off. As a result, the four cores 131 remain on the film base for clad.

Then, the clad 132 is provided on a surface of the film base for clad formed with the core 131 so as to cover the core 131. For example, the clad 132 includes a film, a layer obtained by coating and curing a curable resin for clad, a polymer film obtained by applying and drying a solvent solution of a polymer material, and the like.

Finally, a surface on which the cores 131 of the optical waveguide are exposed is cut at a predetermined angle using a dicer, thereby forming an optical path conversion surface. Furthermore, by cutting the surface in parallel with the core 131 by the dicer, the optical waveguide 13 having the film base for clad and the clad layer as the clad 132 is manufactured.

Then, the optical waveguide 13 is disposed on the second substrate 11. At this time, the optical waveguide 13 has the curved portion 13a, which is curved along the protruding portion 17 on the second substrate 11. The core exposure surface 134 out of which the core 131 is exposed is formed by removing a part of the clad 132 in the curved portion 13a by cutting or polishing, for example, as shown in FIG. 2B.

Then, the first substrate 10 is disposed on the optical waveguide 13, which is disposed on the second substrate 11. The first and second optical modules 12A and 12B, electronic components, power supply components, and the like are mounted on the first substrate 10.

(2) Inspection of Photoelectric Circuit Board

Figure 3:
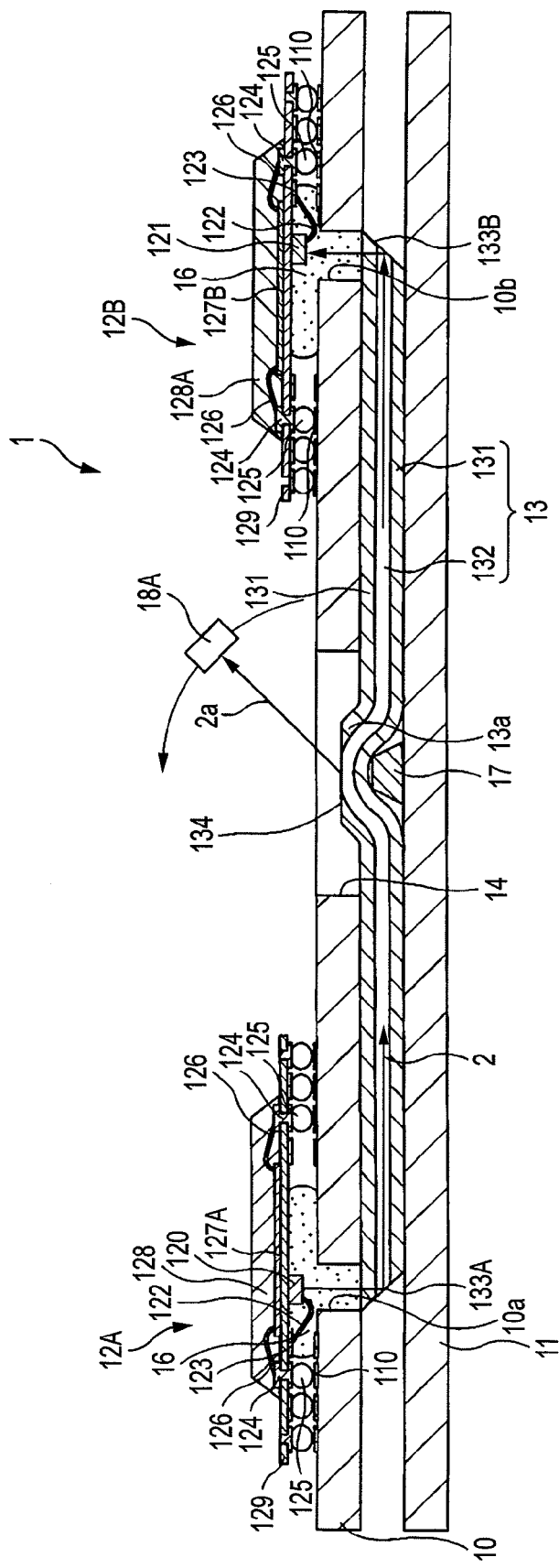
FIG. 3 is a section view that corresponds to the section view taken along the line B-B in FIG. 1A and shows how to inspect a first optical module according to the first exemplary embodiment of the invention.

FIG. 3 is a section view taken along the line B-B of FIG. 1A, which illustrates how to inspect the first optical module 12A.

First, the optical signal 2 is output from each of the four light emitting elements 120a of the light emitting element array 120 of the first optical module 12A. The output optical signals 2 are transmitted through the emission-side openings 10a. Then, optical paths of the optical signals 2 are converted by the optical path conversion surface 133A. The optical signals 2 propagate through the core 131 of the optical waveguide 13.

A part of the optical signals 2 having propagated through the four cores 131 are output as inspection light 2a from the core exposure surface 134 to the outside. Inspection light 2a is received by a received light inspecting portion 18A configured to include four photodiodes, for example. At this time, the received light inspecting portion 18A is rotated around the curved portion 13a to detect the maximum output value from the four photodiodes of the received light inspecting portion 18A.

If the received light inspecting portion 18A detects that the four inspection light beams 2a have a proper light amount, it can be found that the first optical module 12A normally operates. After the inspection is completed, the inspection opening 14 is sealed with the clad material filling portion 15.

If the number of inspection light beams 2a that are detected to have the proper light amount by the received light inspecting portion 18A is three or less, it can be found that the corresponding light emitting element 120a of the first optical module 12A malfunctions or there is some trouble in the optical path due to, for example, a dirt or the like adhered to the optical path conversion surface 133A of the optical waveguide 13 facing the light emitting element array 120.

Figure 4:
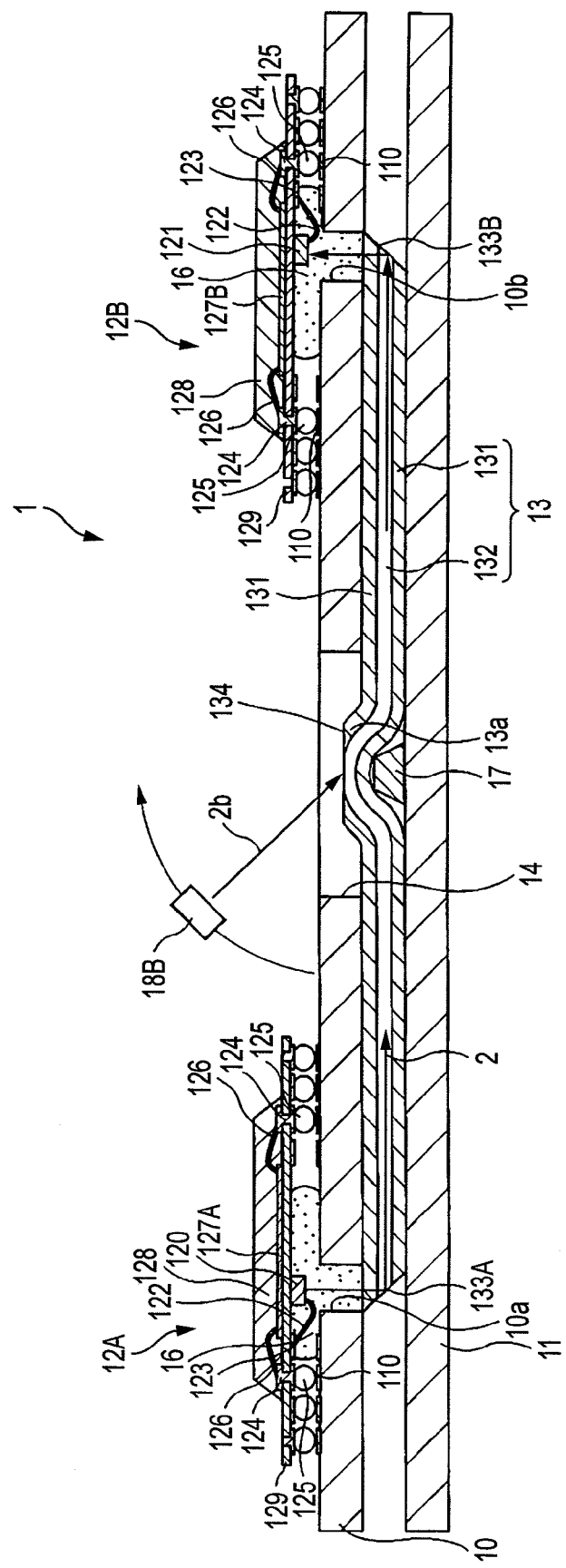
FIG. 4 is a section view that corresponds to the section view taken along the line B-B in FIG. 1A and shows how to inspect a second optical module according to the first exemplary embodiment of the invention.

FIG. 4 is a section view taken along the line B-B of FIG. 1A, which illustrates how to inspect the second optical module 12B.

First, four inspection light beams 2b emitted from a light emission inspecting portion 18B including four light emitting elements are incident on the core exposure surface 134. At this time, the light emission inspecting portion 18B is rotated around the curved portion 13a so that the inspection light beams 2b having the maximum light intensity are incident on the core exposure surface 134 from the four light emitting elements of the light emission inspecting portion 18B. The inspection light beams 2b are incident on the four cores 131 from the core exposure surface 134 and propagate through the cores 131 toward the second optical module 12B. Optical paths of the inspection light beams 2b having propagated through the cores 131 are converted by the optical path conversion surface 133B. Then, the inspection light beams 2b are received by the four light receiving elements 121a of the light receiving element array 121 of the second optical module 12B. The light receiving elements 121a convert the received inspection light beams 2b into electrical signals and then output electrical signals.

If the light receiving element array 121 detects that the four inspection light beams 2b has the proper light amount, it can be found that the second optical module 12B normally operates. After the inspection is completed, the inspection opening 14 is sealed with the clad material filling portion 15.

If the number of inspection light beams 2b that can be detected to have the proper light amount by the light receiving element array 121 is three or less, it can be found that the corresponding light receiving element 121a of the second optical module 12B malfunctions or there is a trouble in an optical path due to, for example, a dirt or the like adhered to the optical path conversion surface 133B of the optical waveguide 13 facing the light receiving element array 121.

(Operation of Photoelectric Circuit Board)

Hereinafter, an operation of the photoelectric circuit board 1 will be described with reference to FIGS. 1A and 1B and 2A and 2B.

(1) Transmission and Reception of Optical Signal

The case in which an image signal is transmitted from the first optical module 12A to the second optical module 12B will be described below as an example. The driving circuit of the control section 127A of the first optical module 12A transmits a driving signal to the light emitting element 120a of the light emitting element array 120 based on an image signal. The light emitting element 120a transmits the optical signal 2 to the optical path conversion surface 133A of the optical waveguide 3 through the emission-side opening 10a, based on the driving signal. At this time, a voltage of the driving signal is applied between the p-type electrode and the n-type electrode of the light emitting element 120a to output a laser beam having a wavelength of 850 nm, for example, as the optical signal 2 from a light emitting region of the light emitting layer.

The optical path conversion surface 133A converts an optical path of the optical signal 2 transmitted from the light emitting element 120a so that the optical signal 2 propagates through the core 131 of the optical waveguide 13. The optical path of the optical signal 2 having propagated through the core 131 is converted by the optical path conversion surface 133B. Then, the optical signal 2 is transmitted through the receiving-side opening 10b and is received by the light receiving element array 121 of the second optical module 12B. The light receiving element 121a converts the received optical signal 2 into an electrical signal and outputs the converted electrical signal to the control section 127B.

The amplifying circuit of the control section 127B amplifies the converted electrical signal, and the signal processing circuit generates an image signal by processing the signal from the amplifying circuit and outputs the image signal to a predetermined electronic component on the first and second substrates 10 and 11.

Second Exemplary Embodiment

Figure 5:
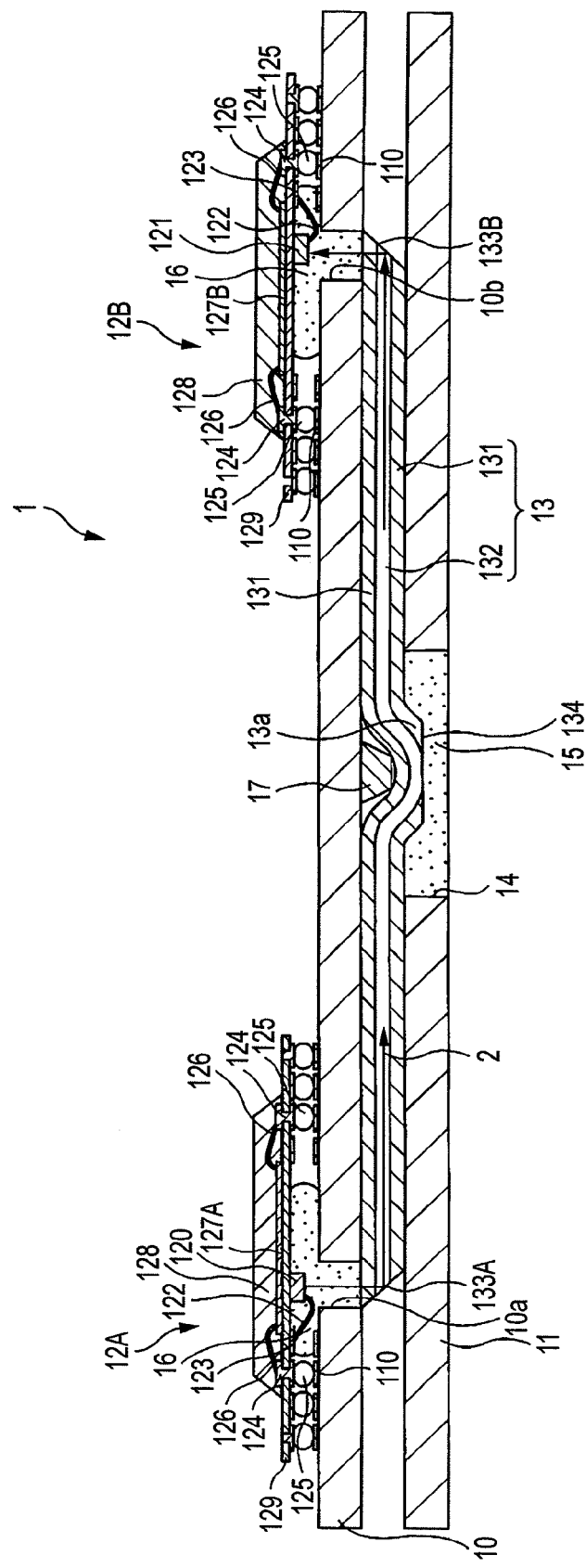
FIG. 5 is a section view that corresponds to the section view take along the line B-B in FIG. 1A and shows the schematic configuration of a photoelectric circuit board according to a second exemplary embodiment of the invention.

FIG. 5 is a section view taken along the line B-B of FIG. 1A, which illustrates the schematic configuration of a photoelectric circuit board according to a second exemplary embodiment of the invention.

In the first exemplary embodiment, the inspection is performed from a side of the first substrate 10. In the second exemplary embodiment, inspection is performed from a side of the second substrate 11.

In the first substrate 10, the emission-side opening 10a and the receiving-side opening 10b are formed in positions where the emission-side opening 10a and the receiving-side opening 10b face the light emitting element 120a and the light receiving element 121a. However, an inspection opening is not formed in the first substrate 10. The second substrate 11 is formed with the inspection opening 14. The protruding portion 17 is provided on a lower surface of the first substrate 10 and in a position corresponding to the inspection opening 14.

The optical waveguide 13 is exposed to the inspection opening 14, which is formed in the second substrate 11, along the protruding portion 17 provided on the first substrate 10. The optical waveguide 13 has the curved portion 13a, which is curved toward the inspection opening 14. A core exposure surface 134 is formed in the curved portion 13a so that the core 131 is exposed from the clad 132.

Similar to the first exemplary embodiment, in the second exemplary embodiment, it can be inspected as to whether or not the first optical module 12A, the second optical module 12B, and the optical path conversion surfaces 133A and 133B of the optical waveguide 13 are in normal conditions, by inputting/outputting the inspection light beams 2a and 2b to/from the core exposure surface 134. Since a method of inspecting the photoelectric circuit board 1 is substantially the same as that in the first exemplary embodiment, an explanation thereof will be omitted.

Third Exemplary Embodiment (Configuration of Photoelectric Circuit Board)

FIGS. 6A to 6C are view illustrating a photoelectric circuit board according to a third exemplary embodiment of the invention. FIG. 6A is a perspective view, FIG. 6B is a section view taken along the line A-A of FIG. 6A, and FIG. 6C is a section view taken along the line B-B of FIG. 6A.

A photoelectric circuit board 1001 has an optical circuit and an electronic circuit. The photoelectric circuit board 1001 is configured to include: first and second substrates 1010 and 1011 each having an electronic circuit including various kinds of electronic components, power supply circuit components, and the like; first and second optical modules 1012A and 1012B mounted on a first-surface side (upper side) of the first substrate 1010; and an optical waveguide layer 1130 that is provided between the first and second substrates 1010 and 1011 and optically connects the first and second optical modules 1012A and 1012B with each other.

The first optical module 1012A has a light emitting element 1120A and a light receiving element 1121A. The second optical module 1012B has a light emitting element 1120B and a light receiving element 1121B. Each of the first and second optical modules 1012A and 1012B is formed into a package, and the specific configurations of the first and second optical modules 1012A and 1012B will be described later.

The optical waveguide layer 1130 has first and second optical waveguides 1013A and 1013B that serve as optical transmission paths between the first and second optical modules 1012A and 1012B.

(First Substrate)

The first substrate 1010 includes a substrate base formed of an insulating material, such as glass epoxy resin with a thickness of 0.5 mm, for example, and a conductive pattern which is formed on an upper surface of the substrate base. Various kinds of electronic components, power supply circuit components, and the like are electrically connected to the conductive pattern.

Also, the first substrate 1010 has emission-side openings and receiving-side openings, which will be described later, formed in positions where the emission-side openings and the receiving-side openings face the light emitting elements 1120A and 1120B and the light receiving elements 1121A and 1121B. Also, each of the emission-side openings and the receiving-side openings, which are formed to correspond to the first and second optical modules 1012A and 1012B may be a single opening. In addition, the first substrate 1010 has a substrate-side opening 1014 that is a through hole used to input and output an optical signal for inspection, as shown in FIG. 6A. The upper surface of the substrate-side opening 1014 has a size of 20 mm×0.4 mm, for example.

(Second Substrate)

The second substrate 1011 includes a substrate base formed of an insulating material, such as glass epoxy resin with a thickness of 1 mm, for example, and a conductive pattern which is formed on a lower surface of the substrate base. Various kinds of electronic components, power supply circuit components, and the like are electrically connected to the conductive pattern.

(Optical Waveguide)

The first optical waveguide 1013A includes the optical waveguide layer 1130 having a thickness of 0.2 mm, for example, as shown in FIG. 6B. The optical waveguide layer 1130 is configured to include a core 1132 which has a rectangular sectional shape and has a thickness of 50 μm, for example, and a clad 1131 which is formed around the core 1132 and has refractive index smaller than the core 1132, as shown in FIG. 6C. The second optical waveguide 1013B is configured in the same manner as the first optical waveguide 1013A.

The first and second optical waveguides 1013A and 1013B have an optical-waveguide-side opening 1135 in a position corresponding to the substrate-side opening 1014 formed in the first substrate 1010. The optical-waveguide-side opening 1135 is configured such that the cores 1132 of the first and second optical waveguides 1013A and 1013B are exposed. The size of the upper surface of the optical-waveguide-side opening 1135 is the same as that of the substrate-side opening 1014. The depth of the optical-waveguide-side opening 1135 is the same as the thickness 75 µm of the clad 1131 on the core 1132. Therefore, the substrate-side opening 1014 and the optical-waveguide-side opening 1135 may be collectively referred to as an opening 1150.

In an end of the optical waveguide layer 1130, a sealing agent 1200, such as an epoxy resin, seals edges of the substrates. Sealing using the sealing agent 1200 may also be partially performed and is not limited to the configurations described above.

(Method of Manufacturing Optical Waveguide)

Next, a method of manufacturing the first and second optical waveguides 1013A and 1013B will be described. The first and second optical waveguides 1013A and 1013B may be manufactured by using, for example, a photolithography or RIE (reactive ion etching) which is generally used in this technical field. In particular, the first and second optical waveguides 1013A and 1013B can be efficiently manufactured by a manufacturing process using a mold disclosed in JP 2004-29507 A (corresponding to US 2004/0033007 A and US 2005/0196096 A)). This manufacturing process will be described below.

First, a master disk formed with protruding portions corresponding to the cores 1132 is manufactured by the photolithography, for example. Then, a layer of a curable resin having a property of allowing light in an ultraviolet range or a visible range, for example, to transmit therethrough and having a viscosity of about 500 to 7000 mPa·s is formed on a surface of the master disk by coating or the like and is then cured to thereby form a hardening layer. The curable resin may be curable organopolysiloxane containing a methylsiloxane group, an ethylsiloxane group, and a phenylsiloxane group in molecules. Then, the hardening layer is peeled off from the master disk and a mold having recess portions corresponding to the protruding portions is manufactured.

Then, a film base for clad made of a resin excellent in adhesiveness with the mold, for example, an alicyclic acrylic resin film, an alicyclic olefin resin film, a triacetic acid cellulose film, or a fluororesin film is brought to be in close contact with the mold. Then, the recess portions of the mold are filled with a curable resin, such as epoxy-based, polyimide-based, or acrylic-based ultraviolet curable resin, ultraviolet curable or heat curable monomer and oligomer, and a compound of monomer and oligomer. Then, the curable resin in the recess portions is cured to make the cores 1132, and then the mold is peeled off. As a result, the cores 1132 remain on the film base for clad.

Then, the clad 1131 is provided on a surface of the film base for clad formed with the cores 1132 so as to cover the cores 1132. At this time, the optical-waveguide-side opening 1135 in which the clad 1131 is not formed is provided in the position corresponding to the substrate-side opening 1014 of the first substrate 1010 so that the cores 1132 are exposed. For example, the clad 1131 includes a film, a layer obtained by coating and curing a curable resin for clad, a polymer film obtained by coating and drying a solvent solution of a polymer material, and the like.

Finally, a surface on which the core 1132 of the optical waveguide is exposed is cut at a predetermined angle by using a dicer, thereby forming an optical path conversion surface. Furthermore, by cutting the surface in parallel with the core 1132 by the dicer, the first and second optical waveguides 1013A and 1013B each having the film base for clad and the clad layer as the clad 1131 are completed.

(Optical Module)

FIGS. 7A and 7B are views schematically illustrating the photoelectric circuit board according to the third exemplary embodiment of the invention. FIG. 7A is a section view taken along the line C-C of FIG. 6A, and FIG. 7B is a section view illustrating a D part of FIG. 7A. Although the configuration of the first optical module 1012A will be described below, the second optical module 1012B also has the same configuration and function. The first optical module 1012A includes: a substrate 1129; the light emitting element 1120A and the light receiving element 1121A mounted on a lower surface of the substrate 1129; a control section 1127A mounted on an upper surface of the substrate 1129; a terminal 1124; a wiring 1126; and a sealing resin 1128 such as an epoxy resin for sealing the control section 1127A.

The light receiving element 1121A (the same is true for the light emitting element 1120A) of the first optical module 1012A is electrically connected to the control section 1127A provided on the substrate 1129 through a wiring 1122 and a pad 1123, as shown in FIG. 7A.

The control section 1127A includes a driving circuit for driving the light emitting element 1120A and an amplifying circuit for amplifying an electrical signal output from the light receiving element 1121A. The control section 1127A is electrically connected to a terminal 1110 through the wiring 1126, the terminal 1124, and a solder ball 1125 and is protected by the sealing resin 1128.

For example, a surface optical element, such as a surface photodiode, can be used as the light receiving element 1121A. In this exemplary embodiment, a GaAs type PIN photodiode excellent in terms of high-speed response is used as the light receiving element 1121A. The PIN photodiode includes a P layer, an I layer, and an N layer that form a PIN injunction, a p-type electrode connected to the P layer, and an n-type electrode formed in the N layer, which are all formed on a GaAs substrate.

A plurality of light emitting elements (surface optical elements), such as surface emitting diodes or surface lasers, can be used as the light emitting element 1120A of the first optical module 1012A. In this exemplary embodiment, a VCSEL (vertical cavity surface emitting laser) is used as the light emitting element 1120A.

The surface emitting laser has an n-type upper reflection mirror layer, an active layer, a current constriction layer, a p-type lower reflection mirror layer, a p-type contact layer, and a p-type electrode formed in an n-type GaAs substrate and an n-type electrode formed on an upper surface of the n-type GaAs substrate, for example.

The opening 1150 of the photoelectric circuit board 1001 is used during inspection performed by a light emitting device 1003, and an explanation thereof will be made later.

Operation of Third Exemplary Embodiment

An operation of the photoelectric circuit board according to the third exemplary embodiment of the invention will be described with reference to FIGS. 6A to 6C, 7A and 7B.

(Transmission and Reception of Optical Signal)

Here, description will be given on the case where an image signal is transmitted from the first optical module 1012A to the second optical module 1012B, as an example. The control section 1127A of the first optical module 1012A transmits a driving signal based on an image signal to the light emitting element 1120A, and the light emitting element 1120A transmits an optical signal 1002 based on the driving signal toward an optical-path conversion surface 1133A through a emission-side opening 1100A.

At this time, a voltage of the driving signal is applied between the p-type electrode and the n-type electrode of the light emitting element 1120A, and a laser beam with a wavelength of 850 nm, for example, is output as the optical signal 1002 from the light emitting region of the light emitting layer.

The optical-path conversion surface 1133A converts an optical path of the optical signal 1002 transmitted from the light emitting element 1120A so that the optical signal 1002 propagates through the second optical waveguide 1013B.

The optical path of the optical signal 1002 having propagated through the second optical waveguide 1013B is converted by an optical-path conversion surface 1133B.

The optical signal 1002 is transmitted through a receiving-side opening 1101B and is then received by the light receiving element 1121B of the second optical module 1012B. The light receiving element 1121B converts the received optical signal 1002 into an electrical signal and outputs the converted electrical signal to a control section 1127B.

The control section 1127B generates an image signal by processing the converted electrical signal and outputs the image signal to a predetermined electronic component on the first substrate 1010.

(Inspection of Photoelectric Circuit Board)

In this exemplary embodiment, description will be given on the case where the photoelectric circuit board 1001 is inspected by introducing an optical signal 1020 for inspection, which is output from the light emitting device 1003, into the second optical waveguide 1013B.

Grease 1031 is applied to a light output end of an optical fiber 1030 and then, the light output end of the optical fiber 1030 is inserted into the substrate-side opening 1014 and the optical-waveguide-side opening 1135, such that the light output end of the optical fiber 1030 is optically connected to the core 1132 of the exposed second optical waveguide 1013B with the Grease 1031 interposed therebetween, as shown in FIG. 7B.

As shown in FIG. 7B, the optical fiber 1030 is configured to include a core 1301, which has a circular shape in section, and a clad 1302 which is formed around the core 1301 and has a refractive index smaller than that of the core 1301. The light output end of the optical fiber 1030 is processed so as to be easily optically connected to the core 1132 exposed to the optical-waveguide-side opening 1135 by using a dicing saw, for example, and is coated with the Grease 1031 having a refractive index close to that of the core 1132 in order to prevent an optical signal from being scattered by air.

Then, the light emitting device 1003 introduces the optical signal 1020 for inspection into the core 1132 of the second optical waveguide 1013B through the optical fiber 1030 and the Grease 1031.

If the light receiving element 1121B of the second optical module 1012B outputs an electrical signal based on the optical signal 1020 for inspection to the control section 1127B, it can be found that the first optical waveguide 1013A and the light receiving element 1121B of the second optical module 1012B are in normal conditions.

If the light receiving element 1121B of the second optical module 1012B does not output an electrical signal based on the optical signal 1020 for inspection to the control section 1127B, it can be found that any one of the second optical waveguide 1013B and the light receiving element 1121B of the second optical module 1012B is in an abnormal condition.

Inspection of the first optical waveguide 1013A and the light receiving element 1121A of the first optical module 1012A are performed by introducing the optical signal 1020 for inspection into the first optical waveguide 1013A in the same manner as described above.

After the inspection is completed, the opening 1150 is sealed with the sealing agent 1200, for example, in order to confine the optical signal 1002 propagating through the first and second optical waveguides 1013A and 1013B within the first and second optical waveguides 1013A and 1013B.

Also, the light emitting device 1003 shown in FIG. 7A may be replaced with a light receiving device so that inspection of the light emitting element 1120A of the first optical module, the light emitting element 1120B of the second optical module 1012B, and the first and second optical waveguides 1013A and 1013B can be performed by checking as to whether or not the optical signal 1002 propagating through the core 1132 can be obtained.

Fourth Exemplary Embodiment

In the following description, a portion having the same configuration and function as in the third exemplary embodiment is denoted by a similar reference numeral.

FIG. 8 is a section view illustrating a photoelectric circuit board in which a jig according to a fourth exemplary embodiment of the invention is inserted. FIGS. 9A to 9D are views schematically illustrating the jig according to the fourth exemplary embodiment of the invention. FIG. 8 is a section view taken along the line C-C of FIG. 6A. FIG. 9A is a plan view illustrating an upper surface of the jig, FIG. 9B is a plan view illustrating a lower surface of the jig, FIG. 9C is an enlarged view illustrating an E portion of FIG. 8, and FIG. 9D is an enlarged view illustrating an F portion of FIG. 8 which represent the case of performing inspection using the jig. An inspection equipment for inspecting the photoelectric circuit board 1001 in this exemplary embodiment includes a light emitting device 1003, a light receiving device 1004, optical fibers 1030 and 1040, and a jig 1005.

(Jig)

The jig 1005 has a height of 1 mm, a width of 0.4 mm, and a length of 20 mm, for example. Also, the jig 1005 is configured to include cores 1051a and 1051b, each of which has a rectangular shape in section, and a clad 1050 which is formed around the cores 1051a and 1051b and has a refractive index smaller than those of the cores 1051a and 1051b.

The core 1051a has such a shape that two cores cross each other. As shown in FIGS. 9A and 9B, the core 1051a includes: an input surface 1052a which is provided in an upper portion of the jig 1005 and to which the optical signal 1020 for inspection is introduced; an output surface 1052b which is provided in a lower portion of the jig 1005 so as to be opposite to the input surface 1052a and which outputs the optical signal 1020 for inspection to the core 1132 through the grease 1031; an input surface 1053a which is provided in the lower portion of the jig 1005 and into which the optical signal 1002 propagating through the first optical waveguide 1013A propagates through the grease 1031 as an optical signal 1021 for inspection; and an output surface 1053b which is provided in the upper portion of the jig 1005 so as to be opposite to the input surface 1053a and from which the optical signal 1021 for inspection is output.

The core 1051b such has a shape that two cores cross each other, as shown in FIG. 8. As shown in FIGS. 9A and 9B, the core 1051b includes: an input surface 1054a which is provided in the upper portion of the jig 1005 and to which the optical signal 1020 for inspection is introduced; an output surface 1054b which is provided in the lower portion of the jig 1005 so as to be opposite to the input surface 1054a and which outputs the optical signal 1020 for inspection to the core 1132 through the grease 1031; an input surface 1055a which is provided in the lower portion of the jig 1005 and into which the optical signal 1002 propagating through the second optical waveguide 1013B propagates through the grease 1031 as the optical signal 1021 for inspection; and an output surface 1055b which is provided in the upper portion of the jig 1005 so as to be opposite to the input surface 1055a and from which the optical signal 1021 for inspection is output.

The cores 1051a and 1051b may not cross each other and are not limited to these configurations so long as the cores 1051a and 1051b can introduce and output the optical signals 1020 and 1021 for inspection.

(Method of Manufacturing Jig)

The jig 1005 may be manufactured by using, for example, a photolithography or RIE (reactive ion etching) which is generally used in this technical field. However, in this exemplary embodiment, the jig 1005 is manufactured by pasting two optical waveguides manufactured by using the same method of manufacturing the first and second optical waveguides 1013A and 1013B in the third exemplary embodiment. Subsequently, the input surfaces 1052a, 1053a, 1054a, and 1055a and the output surfaces 1052b, 1053b, 1054b, and 1055b are formed by cutting the surface on which the cores 1051a and 1051b are exposed by using a dicer. Also, the clad 1050 and the cores 1051a and 1051b are made of the same materials as those used in the optical waveguide layer 1130. However, any kind of material may be used so long as the optical signals 1020 and 1021 for inspection can be introduced and output.

(Light Emitting Device and Light Receiving Device)

Similar to the third exemplary embodiment, the light emitting device 1003 is configured such that the optical signal 1020 for inspection is output through the optical fiber 1030. As shown in FIG. 9C, a lens 1041 is provided at the light output end of the optical fiber 1030, and the lens 1041 is optically connected to the input surfaces 1052a and 1054a of the jig 1005 with the grease 1031 interposed therebetween.

The light receiving device 1004 is configured such that the optical signal 1021 for inspection is introduced thereinto through the optical fiber 1040. The optical fiber 1040 is configured in the same manner as the optical fiber 1030. As shown in FIG. 9D, the lens 1041 is provided at the light input end of the optical fiber 1040, and the lens 1041 is optically connected to the output surfaces 1053b and 1055b of the jig 1005 with the grease 1031 interposed therebetween.

(Inspection of Photoelectric Circuit Board)

(1) Inspection Using Light Emitting Device

First, inspection of the photoelectric circuit board 1001 using the light emitting device 1003 will be described. The jig 1005 having the grease 1031 applied onto its lower surface is first inserted into the opening 1150. As shown in FIGS. 8 and 9B, the input surface 1053a and the output surface 1052b provided at the lower portion of the jig 1005 is optically connected to the exposed core 1132 of the first optical waveguide 1013A with the grease 1031 interposed therebetween. The input surface 1055a and the output surface 1054b are optically connected to the exposed core 1132 of the second optical waveguide 1013B with the grease 1031 interposed therebetween.

Subsequently, the light emitting device 1003 introduces the optical signal 1020 for inspection into the input surface 1054a of the jig 1005 through the optical fiber 1030, the lens 1041, and the grease 1031. The optical signal 1020 for inspection propagates toward the core 1051b from the input surface 1054a and propagates toward the core 1132 of the second optical waveguide 1013B from the output surface 1054b shown in FIG. 9B. If there is no problem in the second optical waveguide 1013B, an optical path of the optical signal 1020 for inspection having propagated through the second optical waveguide 1013B is converted by the optical-path conversion surface 1133B and is then transmitted through the receiving-side opening 1101B to reach the light receiving element 1121B.

If the light receiving element 1121B of the second optical module 1012B outputs an electrical signal based on the optical signal 1020 for inspection to the control section 1127B, it can be found that the second optical waveguide 1013B and the light receiving element 1121B of the second optical module 1012B are in normal conditions.

If the light receiving element 1121B of the second optical module 1012B does not output an electrical signal based on the optical signal 1020 for inspection to the control section 1127B, it can be found that at least one of the second optical waveguide 1013B and the light receiving element 1121B of the second optical module 1012B is in an abnormal condition.

Similar to the above inspection method, the optical signal 1020 for inspection is introduced from the light emitting device 1003 to the input surface 1052a through the optical fiber 1030, the lens 1041, and the grease 1031. Then, the first optical waveguide 1013A and the light receiving element 1121A of the first optical module 1012A can be inspected by checking as to whether or not the light receiving element 1121A of the first optical module 1012A has received the optical signal 1020 for inspection.

(2) Inspection Using Light Receiving Device

Next, inspection of the photoelectric circuit board 1001 using the light receiving device 1004 will be described. First, the optical signal 1002 is output from the light emitting element 1120A of the first optical module 1012A. The output optical signal 1002 is transmitted through the emission-side opening 1100A, and then an optical path of the optical signal 1002 is converted by the optical-path conversion surface 1133A. Then, the optical signal 1002 propagates through the second optical waveguide 1013B.

A part of the optical signal 1002 having propagated through the second optical waveguide 1013B propagates as the optical signal 1021 for inspection from the input surface 1055a of the jig 1005 to the core 1051b, which are shown in FIG. 9B, through the exposed core 1132 of the optical-waveguide-side opening 1135 to the grease 1031.

The optical signal 1021 for inspection having propagated through the core 1051b propagates toward the optical fiber 1040 through the grease 1031 and the lens 1041. Then, the light receiving device 1004 receives the optical signal 1021 for inspection and outputs an electrical signal based on the optical signal 1021 for inspection to the predetermined electronic circuit or the like.

If the light receiving device 1004 cannot receive the optical signal 1021 for inspection, it can be found that at least one of the second optical waveguide 1013B and the light emitting element 1120A of the first optical module 1012A is in an abnormal condition.

Similar to the inspection method described above, it is possible to inspect the first optical waveguide 1013A and the light emitting element 1120B of the second optical module 1012B by checking as to whether or not the light receiving device 1004 receives the optical signal 1021 for inspection, which is a part of the optical signal 1002 output from the light emitting element 1120B of the second optical module 1012B, through the input surface 1053a, the output surface 1053b, the grease 1031, the lens 1041, and the optical fiber 1040.

After the inspection is completed, the substrate-side opening 1014 and the optical-waveguide-side opening 1135 are sealed with the sealing agent 1200, for example, in order to confine the optical signal 1002 propagating through the first and second optical waveguides 1013A and 1013B within the first and second optical waveguides 1013A and 1013B.

In the third and fourth exemplary embodiments described above, the opening 1150 is provided in the first substrate 1010. However, the opening 1150 may also be provided in the second substrate 1011 and is not limited to the configurations described above.

It should be noted that the invention is not limited to the above-described exemplary embodiments, but may be modified in various ways without departing from the spirit and scope of the invention.

What is claimed is:

1. A photoelectric circuit board comprising:
    a substrate formed with
        an emission-side opening that allows an optical signal to transmit from a first-surface side of the substrate to a second-surface side of the substrate,
        a receiving-side opening that allows the optical signal to transmit from the second-surface side of the substrate to the first-surface side of the substrate, and
        an inspection opening that is disposed between the emission-side opening and the receiving-side opening;
    a light emitting element that is mounted on the first-surface side of the substrate and is disposed in a position where the light emitting element faces the emission-side opening, wherein the light emitting element emits the optical signal;
    a light receiving element that is mounted on the first-surface side of the substrate and is disposed in a position where the light receiving element faces the receiving-side opening, wherein the light receiving element receives the optical signal;
    an optical waveguide that includes a core and a clad formed around the core, the optical waveguide being formed on the second-surface side of the substrate, the optical waveguide having
        a first optical path conversion surface that redirects an optical path of the optical signal transmitting from the emission-side opening into the core,
        a second optical path conversion surface that redirects an optical path of the optical signal from the core to the receiving-side opening, and
        a portion being exposed to the inspection opening of the substrate and being curved toward the inspection opening; and
        a core exposure surface that is formed in the curved portion of the optical waveguide so that the core is exposed out of the clad.

2. The photoelectric circuit board according to claim 1, further comprising:
    a sealing resin that has a refractive index substantially smaller than that of the core and covers the core exposure surface of the optical waveguide.

3. The photoelectric circuit board according to claim 1, further comprising:
    another substrate disposed on the substrate with the optical waveguide interposed therebetween.

4. A photoelectric circuit board comprising:
    a substrate that includes an electronic circuit and is formed with
        a emission-side opening that allows an optical signal to transmit from a first-surface side of the substrate to a second-surface side of the substrate, and
        a receiving-side opening, which allows the optical signal to transmit from the second-surface side of the substrate to the first-surface side of the substrate;
    a light emitting element that is mounted on a first-surface side of the substrate and is disposed in a position where the light emitting element faces the emission-side opening;
    a light receiving element that is mounted on the first-surface side of the substrate and is disposed in a position where the light receiving element faces the receiving-side opening; and
    an optical waveguide that includes a core and a clad formed around the core, the optical waveguide being formed on the second-surface side of the substrate, the optical waveguide having
        a first optical path conversion surface that redirects an optical path of the optical signal transmitting from the emission-side opening into the core,
        a second optical path conversion surface that redirects the optical path of the optical signal from the core to the receiving-side opening, and
        an inspection opening formed in the clad so that the core is exposed,
        wherein the optical waveguide introduces and outputs an optical signal for inspection through the core exposed to the inspection opening.

5. The photoelectric circuit board according to claim 4, wherein
    the substrate has a substrate-side inspection opening between the emission-side opening and the receiving-side opening, and
    the inspection opening of the optical waveguide is formed in a position corresponding to the substrate-side inspection opening.

6. The photoelectric circuit board according to claim 4, further comprising:
    another substrate disposed on the second-surface side of the substrate with the optical waveguide interposed therebetween, wherein
    the other substrate includes a substrate-side inspection opening disposed in a position corresponding to the inspection opening of the optical waveguide.

* * * * *